(12) United States Patent
Yim

(10) Patent No.: US 12,259,611 B2
(45) Date of Patent: Mar. 25, 2025

(54) TOUCHSCREEN DEVICE AND METHOD OF CONTROLLING THE SAME

(71) Applicant: OD HITEC CO., LTD., Chungcheongnam-do (KR)

(72) Inventor: Robin Yim, Uiwang-si (KR)

(73) Assignee: OD HITEC CO., LTD., Chungcheongnam-do (KR)

( * ) Notice: Subject to any disclaimer, the term of this patent is extended or adjusted under 35 U.S.C. 154(b) by 0 days.

(21) Appl. No.: 18/038,153

(22) PCT Filed: Mar. 10, 2023

(86) PCT No.: PCT/KR2023/003297
§ 371 (c)(1),
(2) Date: May 22, 2023

(87) PCT Pub. No.: WO2023/177156
PCT Pub. Date: Sep. 21, 2023

(65) Prior Publication Data
US 2024/0369872 A1 Nov. 7, 2024

(30) Foreign Application Priority Data

Mar. 14, 2022 (KR) .................. 10-2022-0031668
Sep. 28, 2022 (KR) .................. 10-2022-0123310

(51) Int. Cl.
*G02F 1/1333* (2006.01)
*B60L 53/30* (2019.01)
*G02F 1/1339* (2006.01)
*G06F 3/041* (2006.01)
(Continued)

(52) U.S. Cl.
CPC ...... *G02F 1/133385* (2013.01); *B60L 53/305* (2019.02); *G02F 1/133308* (2013.01); *G02F 1/13338* (2013.01); *G02F 1/13398* (2021.01); *G06F 3/0416* (2013.01); *G06F 3/044* (2013.01); *G09G 3/36* (2013.01); *G02F 2201/38* (2013.01);
(Continued)

(58) Field of Classification Search
CPC ......... G02F 1/133385; G02F 1/133308; G02F 1/13338; G02F 1/13398; G02F 2201/38; G06F 3/0416; G06F 3/044; G09G 3/36; G09G 2320/041; G09G 2320/0626; G09G 2354/00; B60L 53/305
See application file for complete search history.

(56) References Cited

U.S. PATENT DOCUMENTS

| 6,504,713 B1* | 1/2003 | Pandolfi | G06F 1/1601 345/87 |
| 2008/0239634 A1* | 10/2008 | Nakao | G06F 1/1601 361/678 |

(Continued)

*Primary Examiner* — David Tung
(74) *Attorney, Agent, or Firm* — Paratus Law Group, PLLC

(57) ABSTRACT

An air-circulation-type touchscreen device includes a touch panel, an LCD device mounted behind the touch panel, a liquid crystal panel assembly disposed in front of the LCD device, an LCD device bracket fixing and supporting the LCD device, and at least one heated air circulation fan mounted behind the liquid crystal panel assembly to forcibly circulate heat between the touch panel and the liquid crystal panel assembly. A heated air flow space is defined between the touch panel and the liquid crystal panel assembly.

12 Claims, 7 Drawing Sheets

(51) Int. Cl.
*G06F 3/044* (2006.01)
*G09G 3/36* (2006.01)

(52) U.S. Cl.
CPC ............... *G09G 2320/041* (2013.01); *G09G 2320/0626* (2013.01); *G09G 2354/00* (2013.01)

(56) References Cited

U.S. PATENT DOCUMENTS

| | | | |
|---|---|---|---|
| 2011/0210942 A1* | 9/2011 | Kitamori | G06F 3/044 345/174 |
| 2018/0032199 A1* | 2/2018 | Colville | B05D 7/50 |

* cited by examiner

TOUCHSCREEN DEVICE AND METHOD OF CONTROLLING THE SAME

CROSS-REFERENCE TO PRIOR APPLICATIONS

This application is a National Stage patent application of PCT International Patent Application No. PCT/KR2023/003297 (filed on Mar. 10, 2023) under 35 U.S.C. § 371, which claims priority to Korean Patent Application Nos. 10-2022-0031668 (filed on Mar. 14, 2022) and 10-2022-0123310 (filed on Sep. 28, 2022), which are all hereby incorporated by reference in their entirety.

BACKGROUND

The present invention relates to a touchscreen device and a method of controlling the same, and more particularly to an improved touchscreen device, which prevents a blackout phenomenon by forcibly circulating heat so that the heat does not remain in a panel thereof, which increases the lifespan thereof by reducing heat generation, which improves the performance thereof by reducing noise, and which reduces power loss, and a method of controlling the same.

An electric vehicle includes a high-voltage battery and a motor as driving means, and power of the battery is supplied to the motor so that the motor rotates wheels, whereby the electric vehicle moves forwards or backwards.

Such electric vehicles are environmentally friendly because the same does not generate pollutants, and the maintenance cost thereof is very low compared to internal combustion engine vehicles, so long as batteries thereof can be continuously charged.

In recent years, charging infrastructure has been gradually expanded with increase in electric vehicles.

Charging kiosks for charging of electric vehicles are installed in, for example, parking lots in public buildings or parks, rest stops along highways, apartment complexes, and the like.

However, a conventional electric vehicle charging kiosk has a problem of large power consumption because a backlight unit of a liquid crystal display (LCD) or a touchscreen device is maintained in an on state even when not in use.

Further, because the electric vehicle charging kiosk is generally installed outdoors, there is a problem of a so-called blackout, which is a phenomenon that a liquid crystal panel assembly of an LCD or a touchscreen device is blackened due to long-term exposure to strong sunlight, whereby the touchscreen device is easily damaged.

Described in more detail, because an LCD has temperature limits due to the operation characteristics thereof, the characteristics of an LCD panel are deteriorated in a high-temperature environment, for example, in summer, and thus the LCD panel temporarily has operation abnormality of blackout.

For example, assuming that the operating temperature of the LCD is −20 to 70° C., the LCD has no problem at a temperature of −20° C. or lower. However, when the surface of the LCD is exposed to strong direct sunlight (ultraviolet radiation) in summer and thus the surface temperature of the LCD exceeds 70° C., the liquid crystal of the LCD solidifies and is blackened.

Thereafter, when the influence of the sunlight is reduced and thus the surface temperature of the LCD drops to 70° C. or lower, the liquid crystal is restored to the original state thereof.

However, if the LCD is continuously exposed to very strong sunlight, the LCD cell may melt, and thus may not be restored to the original state thereof.

In the case of a touchscreen device, when heat remains between an LCD panel and a touch panel, a blackout phenomenon occurs due to the remaining heat.

Further, because the conventional touchscreen device is installed outdoors as described above, the brightness thereof is not controlled to be suitable for day and night use, which causes inconvenience in use. Furthermore, due to heat generated from a backlight unit and a liquid crystal panel assembly, which are mounted in a sealed space, the performance of the touchscreen device deteriorates, the lifespan thereof decreases, and power loss thereof is large.

SUMMARY

The present invention has been made to solve the above problems, and it is an object of the present invention to provide a touchscreen device, which is capable of reducing power loss, preventing the occurrence of a blackout phenomenon, increasing the lifespan thereof, and improving the performance thereof, and a method of controlling the same.

In order to accomplish the above objects, a touchscreen device according to a first embodiment of the present invention includes a touch panel, an LCD device mounted behind the touch panel, a liquid crystal panel assembly disposed in front of the LCD device, an LCD device bracket configured to fix and support the LCD device, and at least one heated air circulation fan mounted behind the liquid crystal panel assembly in order to forcibly circulate heat between the touch panel and the liquid crystal panel assembly, wherein a heated air flow space is defined between the touch panel and the liquid crystal panel assembly.

According to the present invention, the LCD device bracket has a plurality of heated air flow holes formed therein to allow heat to be forcibly circulated therethrough.

According to the present invention, the heated air circulation fan is fixedly mounted to the LCD device bracket.

According to present invention, an anti-reflection (AR) coating layer is formed on the front surface of the touch panel in order to ensure anti-glare performance.

According to the present invention, preferably, the heated air flow space has a gap of 3 to 10 mm.

A LiDAR sensor configured to generate a detection signal in response to detection of presence or absence of an object in the vicinity of the touchscreen device is mounted on one side of the touchscreen device. It is preferable for the LiDAR sensor to be mounted to a bracket of the touchscreen device.

In addition, a touchscreen device according to another embodiment of the present invention includes a touch panel, an LCD device mounted behind the touch panel, a liquid crystal panel assembly disposed in front of the LCD device, an LCD device bracket configured to fix and support the LCD device, at least one heated air circulation fan mounted behind the liquid crystal panel assembly in order to forcibly circulate heat between the touch panel and the liquid crystal panel assembly, at least one temperature sensor mounted near the touch panel and the liquid crystal panel assembly, the at least one temperature sensor being configured to detect an ambient temperature of the touch panel and the liquid crystal panel assembly, and a controller configured to receive a measured temperature from the temperature sensor and to drive the heated air circulation fan when the measured temperature is higher than a reference temperature.

According to the present invention, a heated air flow space is defined between the touch panel and the liquid crystal panel assembly.

According to the present invention, a heat dissipating member is inserted into the heated air flow space to dissipate heat, and the heat dissipating member includes a heat dissipating silicone member.

According to the present invention, a LiDAR sensor configured to generate a detection signal in response to detection of presence or absence of an object in the vicinity of the touchscreen device is mounted on one side of the touchscreen device, the controller controls the brightness of an LCD of the liquid crystal panel assembly in response to a signal received from the LiDAR sensor, and the LiDAR sensor is mounted to a bracket of the touchscreen device.

According to the present invention, the controller communicates with a PC board to receive time information in real time from the PC board, and controls the brightness of the LCD of the liquid crystal panel assembly based on the time information so that an ambient temperature of the liquid crystal panel assembly is lowered.

According to the present invention, the controller checks the capacitance value of the touch panel to control driving of a touch driver of the touch panel.

According to the present invention, the LCD device bracket has a plurality of heated air flow holes formed therein to allow heat in the heated air flow space to be forcibly circulated therethrough.

According to the present invention, the heated air circulation fan is fixedly mounted to the LCD device bracket.

According to the present invention, an anti-reflection (AR) coating layer is formed on the front surface of the touch panel in order to ensure anti-glare performance.

According to the present invention, preferably, the heated air flow space has a gap of 3 to 10 mm.

In addition, in accordance with another aspect of the present invention, a method of controlling a touchscreen device, which includes a liquid crystal panel assembly disposed in front of an LCD device mounted behind a touch panel, at least one heated air circulation fan mounted behind the liquid crystal panel assembly in order to forcibly circulate heat between the touch panel and the liquid crystal panel assembly, at least one temperature sensor mounted near the touch panel and the liquid crystal panel assembly, the at least one temperature sensor being configured to detect an ambient temperature of the touch panel and the liquid crystal panel assembly, and a power supply configured to supply power to the heated air circulation fan to drive the heated air circulation fan, includes:

(a) applying, by the power supply, power to drive the liquid crystal panel assembly;

(b) receiving, by a controller, a measured temperature from the temperature sensor;

(c) determining, by the controller, whether the measured temperature is higher than a reference temperature; and (d) controlling the heated air circulation fan to be turned on upon determining in step (c) that the measured temperature is higher than the reference temperature and controlling the heated air circulation fan to be turned off upon determining in step (c) that the measured temperature is not higher than the reference temperature.

According to the present invention, the method further includes, after step (a), (e) communicating, by the controller, with a PC board mounted on one side of the touchscreen device to receive time information in real time from the PC board, (f) determining, by the controller having received the time information, whether the current time is day or night based on the time information, and (g) controlling the brightness of an LCD of the liquid crystal panel assembly to reach a reference value upon determining in step (f) that the current time is day and controlling the brightness of the LCD of the liquid crystal panel assembly to be lower than the reference value upon determining in step (f) that the current time is night.

According to the present invention, the method further includes, after step (g), (h) determining, by the controller, whether a capacitance value of the touch panel is within a predetermined range and (i) controlling a touch driver to drive the touch panel upon determining in step (h) that the capacitance value of the touch panel is within the predetermined range and resetting the touch driver upon determining in step (h) that the capacitance value of the touch panel is out of the predetermined range.

According to the present invention, the method further includes, after step (a), (j) detecting, by a LiDAR sensor mounted on another side of the touchscreen device, whether there is an object in the vicinity of the touchscreen device, (k) determining, by the controller having received an object detection signal from the LiDAR sensor, whether the object has been detected, and (l) controlling the brightness of the LCD of the liquid crystal panel assembly to reach the reference value upon determining in step (k) that the object is present in the vicinity.

According to the present invention, heat is caused to circulate without remaining between a touch panel and a liquid crystal panel assembly in a touchscreen device, whereby a blackout phenomenon may be prevented.

In addition, since a LiDAR sensor is mounted to the touchscreen device, the touchscreen device is turned on when an object, for example, a person or a vehicle such as an electric vehicle, approaches, and is turned off in other situations, whereby power consumption may be reduced.

In addition, since an AR coating layer is formed on the front surface of the touch panel, glare due to diffused reflection of the sunlight may be suppressed, visibility may be increased, and the brightness of the touchscreen device may be improved.

In addition, since a controller drives a heated air circulation fan based on comparison between a measured temperature received from a temperature sensor, which is mounted outside or inside the touchscreen device, and a predetermined reference temperature, the controller turns off the heated air circulation fan when the amount of heat generated is not too large, thereby reducing power consumption.

In addition, the brightness of the LCD is lowered at night on the basis of time information received in real time from a PC board so that the temperature of the liquid crystal panel assembly is lowered, whereby the lifespan of the liquid crystal panel assembly may be increased, and standby power consumption may be reduced.

In addition, when a person is detected by the LiDAR sensor, the LCD is controlled to operate with normal brightness, whereby a user may conveniently use the touchscreen device, standby power may be efficiently managed, and the lifespans of the LCD and the heated air circulation fan may be increased.

In addition, the capacitance value of the touch panel is checked, and when the capacitance value is out of a predetermined range, a touch driver is reset, whereby defects in the touch panel may be minimized.

DETAILED DESCRIPTION

Hereinafter, preferred embodiments of the present invention will be described in detail with reference to the accompanying drawings.

Figure 1:
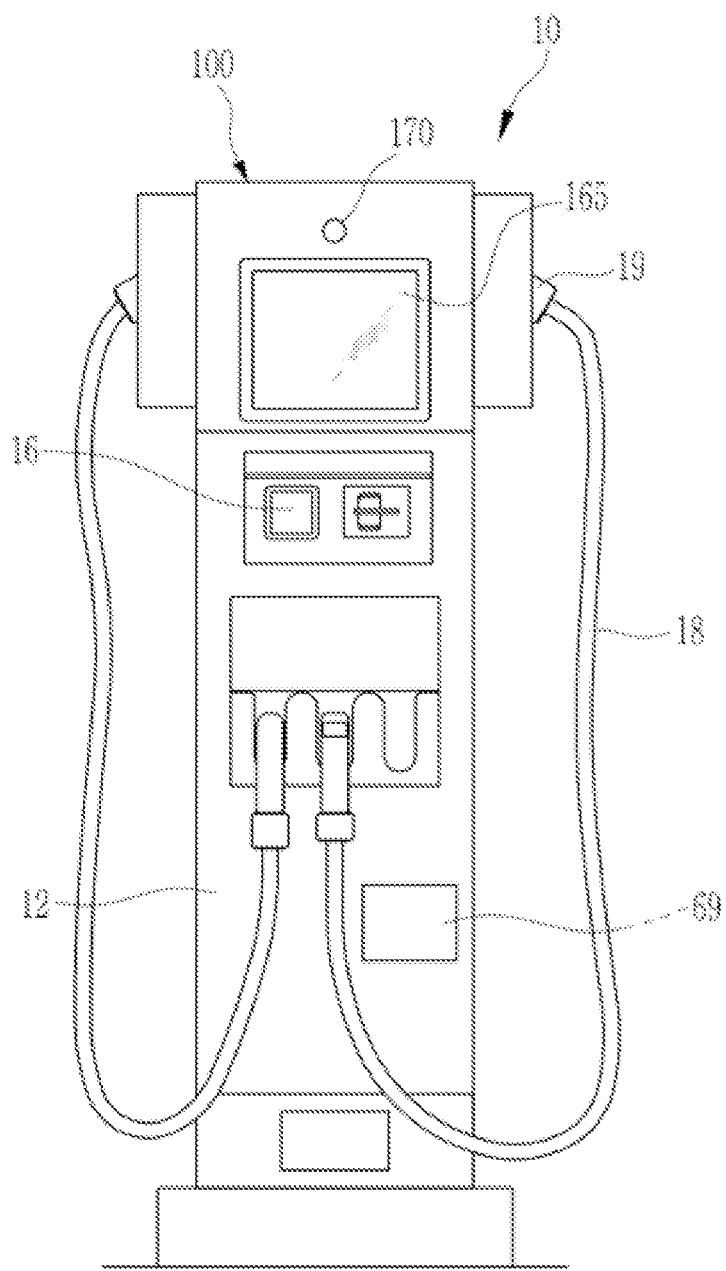
FIG. 1 is a front view showing the front configuration of an electric vehicle charging kiosk to which a touchscreen device according to a first embodiment of the present invention is applied.

FIG. 1 is a front view showing the front configuration of an electric vehicle charging kiosk to which a touchscreen device according to a first embodiment of the present invention is applied.

Figure 2:
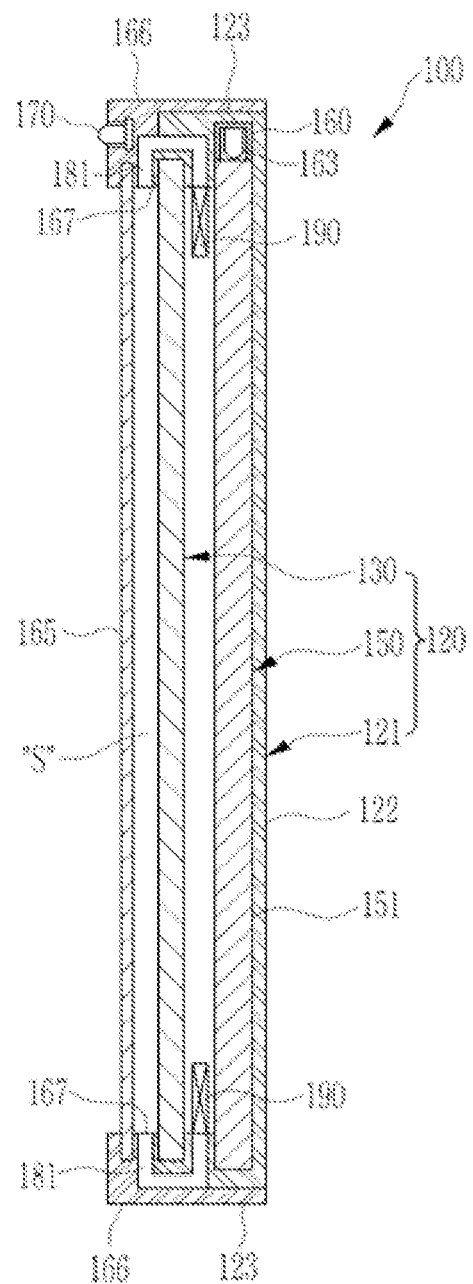
FIG. 2 is a cross-sectional view of the touchscreen device shown in FIG. 1.

In addition, FIG. 2 is a cross-sectional view of the touchscreen device shown in FIG. 1.

Figure 3:
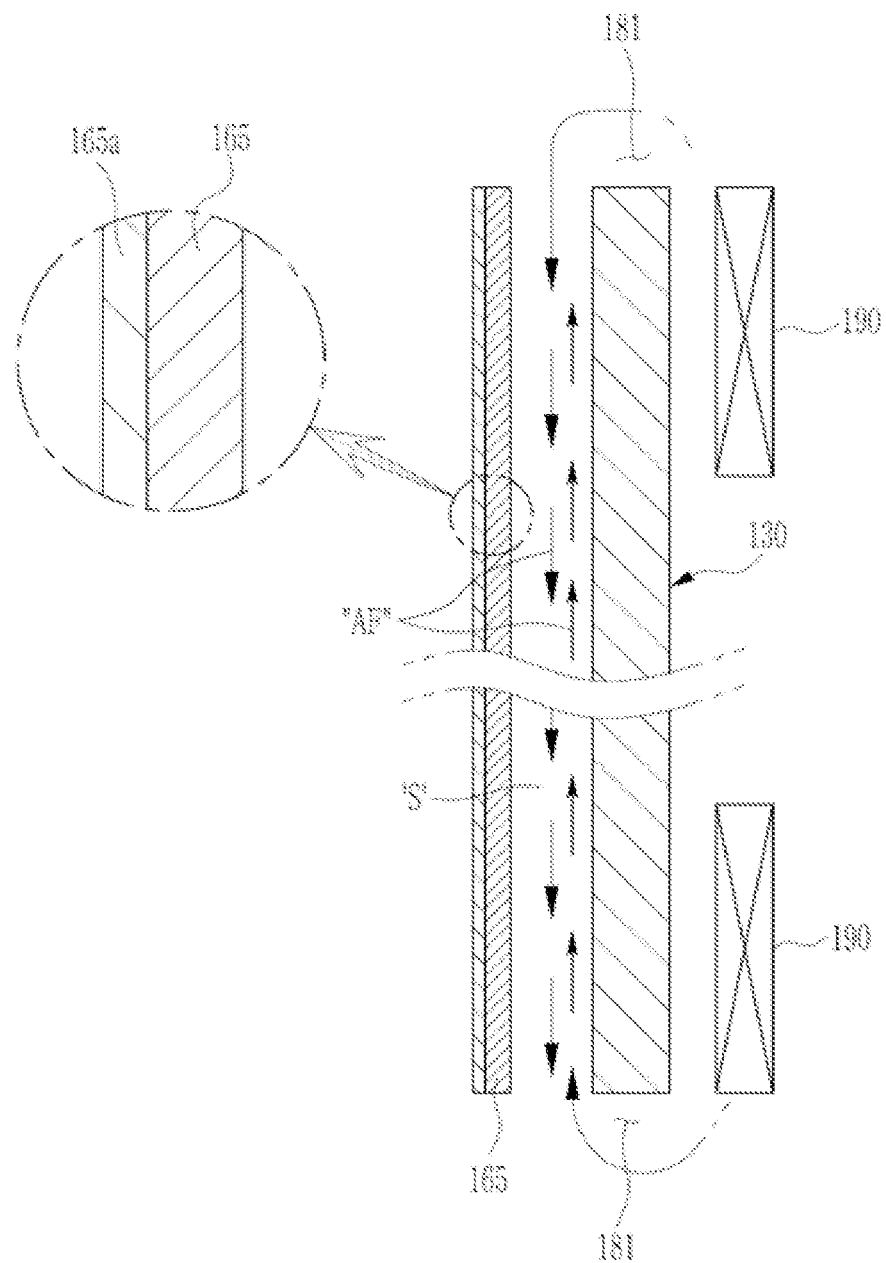
FIG. 3 is a cross-sectional view showing main components shown in FIG. 2 in more detail in order to explain operation of the touchscreen device according to the present invention.

FIG. 3 is a cross-sectional view showing main components shown in FIG. 2 in more detail in order to explain operation of the touchscreen device according to the first embodiment of the present invention.

As shown in FIG. 1, an electric vehicle charging kiosk 10 to which a touchscreen device 100 according to the present invention is applied includes a housing 12, a touch panel 165, an LCD device 120, a LiDAR sensor 170, a payment unit 16, a power line 18, and a controller 69.

The housing 12 is fixed to the ground so as to stand upright. The touch panel 165 and the LCD device 120 are disposed on the front surface of the housing 12. The LiDAR sensor 170 is mounted on an upper end portion of the front surface of the housing 12.

In addition, the LCD device 120 visually provides information necessary for use and management or information about the current state of the kiosk 10 to a user and a manager of the electric vehicle charging kiosk 10.

In addition, the touch panel 165 is an input unit that is disposed in front of the LCD device 120 so as to overlap the LCD device 120 and enables a user to input information about a charging order through touch.

In addition, the payment unit 16 is a credit card payment terminal configured to enable a user to pay the fee for the amount of power used for charging of his/her electric vehicle, and includes, for example, a card information input module (not shown) configured to enable the user to insert or swipe his/her credit card thereinto or therethrough.

In addition, the power line 18 is provided at a distal end thereof with a connector 19. The user may hold the connector 19 with the hand and may insert the connector 19 into a charging terminal of his/her electric vehicle to charge the vehicle.

In addition, the LiDAR sensor 170 is a sensor configured to detect approach of, for example, a person or a vehicle, in a non-contact manner. The LiDAR sensor 170 generates a detection signal in response to detection of approach of an object to a region near the kiosk 10, more specifically, a region near the touch panel 165.

The controller 69 controls operation of the LCD device 120, the touch panel 165, the LiDAR sensor 170, and the payment unit 16, and may include a microcomputer.

FIG. 2 is a cross-sectional view of the touchscreen device shown in FIG. 1, and FIG. 3 is a detailed cross-sectional view for explaining operation of the touchscreen device shown in FIG. 2.

Referring to FIGS. 2 and 3, the LCD device 120 includes a liquid crystal panel assembly 130, a backlight unit 150 disposed behind the liquid crystal panel assembly 130, and an LCD device bracket 121 configured to fix and support the liquid crystal panel assembly 130 and the backlight unit 150.

In addition, an anti-reflection (AR) coating layer 165a is formed on the front surface of the touch panel 165 in order to ensure anti-glare performance.

It is possible to prevent reflection of external light from the surface of the touch panel 165 by forming the AR coating layer 165a. That is, the AR coating layer 165a suppresses reflection of light incident on the front surface of the touch panel 165.

The AR coating layer 165a lowers the reflectance of light introduced from the outside, thereby suppressing glare due to diffused reflection of the sunlight from the front surface of the touch panel 165, thus leading to increase in visibility and further improvement in brightness of the front surface of the LCD device 120.

In addition, the backlight unit 150 includes a light guide plate 151 disposed behind the liquid crystal panel assembly 130 so as to face the liquid crystal panel assembly 130 and a plurality of light-emitting diodes (LEDs) 163 arranged along the side surface of the light guide plate 151.

The light guide plate 151 is a member having a rectangular plate shape, and may be formed of transparent plastic such as, for example, transparent acrylic.

In addition, a bracket rear plate portion 122 of the LCD device bracket 121 may face and support the rear surface of the light guide plate 151. A mirror surface may be formed on the front surface of the bracket rear plate portion 122 that faces the rear surface of the light guide plate 151.

In addition, the plurality of LEDs 163 is fixed to and supported by the LED bracket 160. The LED bracket 160 includes a printed circuit board (PCB) on which the plurality of LEDs 163 is mounted.

Further, since the plurality of high-brightness LEDs 163 is disposed so as to radiate bright light of 1500 candela (cd) or greater to the front surface of the backlight unit 150, the amount of heat generated from the plurality of LEDs 163 is very large.

Therefore, it is preferable that the LED bracket 160 be made of a metal material such as, for example, an aluminum alloy, in order to prevent heat from accumulating in the LED bracket 160 and to smoothly dissipate the heat.

The printed circuit board (PCB) of the LED bracket 160, on which the LEDs are mounted, may also be made of a metal material such as, for example, an aluminum alloy.

In addition, the plurality of LEDs 163 fixed to and supported by the LED bracket 160 is connected to one another in a parallel circuit. This is because, when the plurality of LEDs 163 is connected to one another in a series circuit, the resistance value of the circuit increases, whereby the amount of heat generated becomes larger than when connected in a parallel circuit.

In addition, the light guide plate 151 functions to refract and guide the light introduced thereinto through the side surface thereof from the plurality of LEDs 163 toward the liquid crystal panel assembly 130.

The light guide plate 151 is disposed parallel to the liquid crystal panel assembly 130 so that light entering the rectangular-plate-shaped light guide plate 151 through the side surface thereof is refracted to be radiated forwards through the front surface of the light guide plate 151.

In addition, upon detecting that an object (a vehicle or a person) approaches and is present in a region near the touch panel 165, more specifically, a region near the LiDAR sensor 170, the LiDAR sensor 170 generates a detection signal corresponding thereto.

Upon detecting that the object moves out of the region near the touch panel 165 and is not present in the region near the touch panel 165, the LiDAR sensor 170 generates a detection signal corresponding thereto.

In addition, upon determining that there is no object in the region near the touch panel 165 based on the detection signal generated by the LiDAR sensor 170, which indicates the absence of an object, in the state in which the plurality of LEDs 163 is turned on, the controller 69 turns off the plurality of LEDs 163.

Further, the controller 69 may turn off the plurality of LEDs 163 immediately upon determining that there is no object in the region near the touch panel 165, or may turn off the plurality of LEDs 163 in a predetermined time period, for example, three seconds or five seconds, after the determination.

When the plurality of LEDs 163 is turned off, the front surface of the LCD device 120 appears opaque.

On the other hand, upon determining that there is an object in the region near the touch panel 165 based on the detection signal generated by the LiDAR sensor 170, which indicates the presence of an object, in the state in which the plurality of LEDs 163 is turned off, the controller 69 turns on the plurality of LEDs 163.

Further, the controller 69 may turn on the plurality of LEDs 163 immediately upon determining that there is an object in the region near the touch panel 165, or may turn on the plurality of LEDs 163 in a predetermined time period, for example, one second or three seconds, after the determination.

The electric vehicle charging kiosk 10 turns on the backlight unit 150 of the LCD device 120 only when approach of an object is detected through the detection signal of the LiDAR sensor 170 and the object is present in the region near the LiDAR sensor 170, and turns off the backlight unit 150 of the LCD device 120 when the object is not present near the kiosk 10.

Therefore, power necessary for operation of the electric vehicle charging kiosk 10 is saved.

Further, when turning off the plurality of LEDs 163 upon detecting that there is no object in the region near the touch panel 165, the controller 69 does not turn off the liquid crystal panel of the liquid crystal panel assembly 130, the touch panel 165, the payment unit 16, the LiDAR sensor 170, and the microcomputer (not shown).

In other words, the system of the electric vehicle charging kiosk 10 is maintained in an on state.

Therefore, when approach of an object is detected by the LiDAR sensor 170, the system does not need to be rebooted, and quickly displays information on the LCD device 120 so that a user can use the kiosk 10, thereby providing a substantial power saving effect.

On the other hand, on the contrary, the controller 69 may turn on/off the plurality of LEDs 163 based on the detection signal of the LiDAR sensor 170, and may also turn on/off other components that operate using power supplied thereto, for example, the liquid crystal panel of the liquid crystal panel assembly 130, the touch panel 165, the payment unit 16, and the microcomputer in conjunction with turning on/off the plurality of LEDs 163.

Even in this case, the LiDAR sensor 170 needs to be maintained in an on state so as to continuously detect an object.

In addition, the touch panel 165 may be fixed to and supported by a touch panel bracket 166, and the LCD device 120 may be fixedly fitted in the touch panel bracket 166 in such a manner that the touch panel bracket 166 surrounds a bracket edge portion 123 of the LCD device bracket 121.

The touch panel bracket 166 is fixedly coupled to the housing 12 of the kiosk 10, whereby the touch panel 165 and the LCD device 120 are fixed to the housing 12.

However, unlike what is shown in FIG. 2, the touch panel bracket 166 and the LCD device bracket 121 may be integrally formed with each other.

Therefore, it is preferable for the LiDAR sensor 170 to be mounted to the bracket of the touchscreen device 100, i.e. the touch panel bracket 166, for compatibility with the touchscreen device 100.

In addition, the rear surface of the touch panel 165 and the front surface of the liquid crystal panel assembly 130 are spaced apart from each other by a gap of 3 to 10 mm, and a heated air flow (AF) space S, through which heat (or heated air) is forcibly circulated between the touch panel 165 and the liquid crystal panel assembly 130, is defined.

As shown in FIG. 2, a spacer 167 may be interposed between the touch panel 165 and the liquid crystal panel assembly 130 so that the gap and the heated air flow space S are maintained.

The spacer 167 may be formed as a portion of the touch panel bracket 166.

Meanwhile, if the size (or width) of the gap of the heated air flow space S is smaller than 3 mm, during the daytime or in summer in which the sunlight is strong, heat energy may accumulate between the touch panel 165 and the liquid crystal panel assembly 130 and may not be properly dissipated, leading to damage such as solidification of the liquid crystal of the liquid crystal panel assembly 130.

As a result, there may occur a blackout phenomenon in which a screen corresponding to an electrical signal is not displayed on the front surface of the LCD device 120, and the durability of the LCD device 120 may be reduced.

On the other hand, if the size of the gap is greater than 10 mm, the touch panel 165 may be excessively stretched because a user or a manager habitually presses the touch panel 165 toward the liquid crystal panel assembly 130 located at the rear thereof while touching the touch panel 165, whereby permanent deformation of the touch panel 165, such as stretching or damage, may occur easily.

As a result, the durability of the touch panel 165 may be reduced.

In addition, according to the present invention, at least one heated air circulation fan 190 for forcibly circulating heat is mounted behind the liquid crystal panel assembly 130 of the touchscreen device 100 so that the heat in the heated air flow space S between the liquid crystal panel assembly 130 and the touch panel 165 does not remain and is forcibly circulated, thereby preventing a blackout phenomenon.

Further, the heated air circulation fan 190 may be mounted in any of various manners, so long as the same is capable of forcibly circulating the heat in the heated air flow space S between the liquid crystal panel assembly 130 and the touch panel 165 so that the heat does not remain.

In an embodiment of the present invention, as shown in FIGS. 2 and 3, the heated air circulation fan 190 may be mounted to the LCD device bracket 121.

In addition, a plurality of heated air flow holes 181 is formed in the LCD device bracket 121 so that heat is circulated by the heated air circulation fan 190.

The number of heated air flow holes 181 is not limited, so long as the LCD device bracket 121 does not become structurally weak.

As described above, since the heated air circulation fan 190 and the heated air flow holes 181 are provided in the touchscreen device according to the present invention, the heat between the touch panel 165 and the liquid crystal panel assembly 130 is continuously circulated without remaining therebetween, whereby the temperature between the touch panel 165 and the liquid crystal panel assembly 130 drops, and as a result, a blackout phenomenon may not occur or may be greatly reduced.

In addition, it is also possible to prevent a problem that the touchscreen device 100 does not operate due to heat by reducing the occurrence of a blackout phenomenon and lowering the temperature of the touchscreen device 100 using the heated air circulation fan 190.

Meanwhile, it is generally known that a blackout phenomenon occurs when the touchscreen device receives sunlight and thus the temperature of the touch panel 165 exceeds about 80 to 90° C. and that operation of the touchscreen device becomes impossible when the surface temperature of the touch panel 165 exceeds 75° C.

Figure 4:
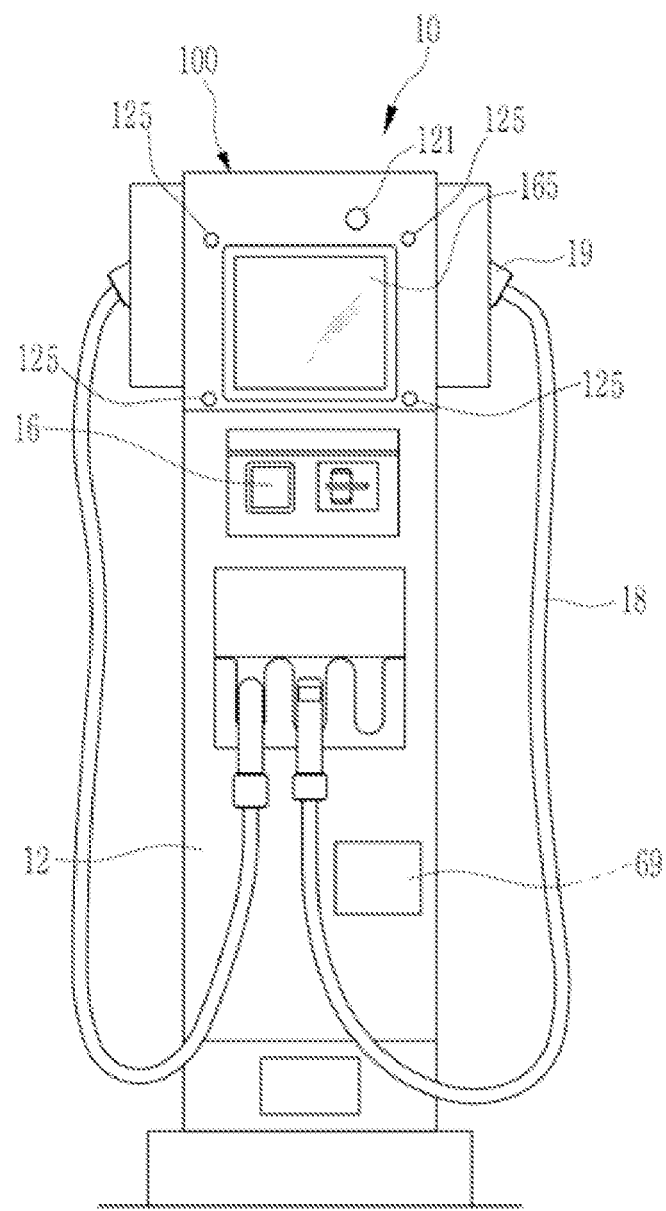
FIG. 4 is a front view showing the front configuration of an electric vehicle charging kiosk to which a touchscreen device according to the present invention is applied.
Figure 5:
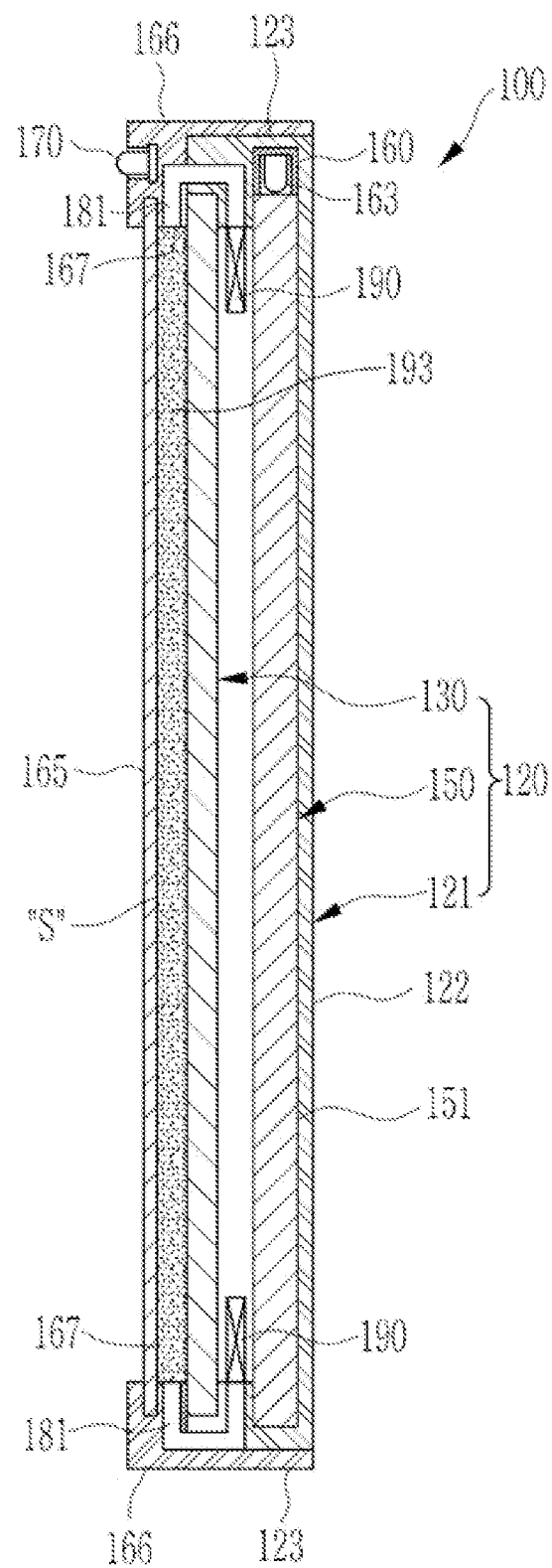
FIG. 5 is a cross-sectional view of another embodiment of the touchscreen device shown in FIG. 4.
Figure 6:
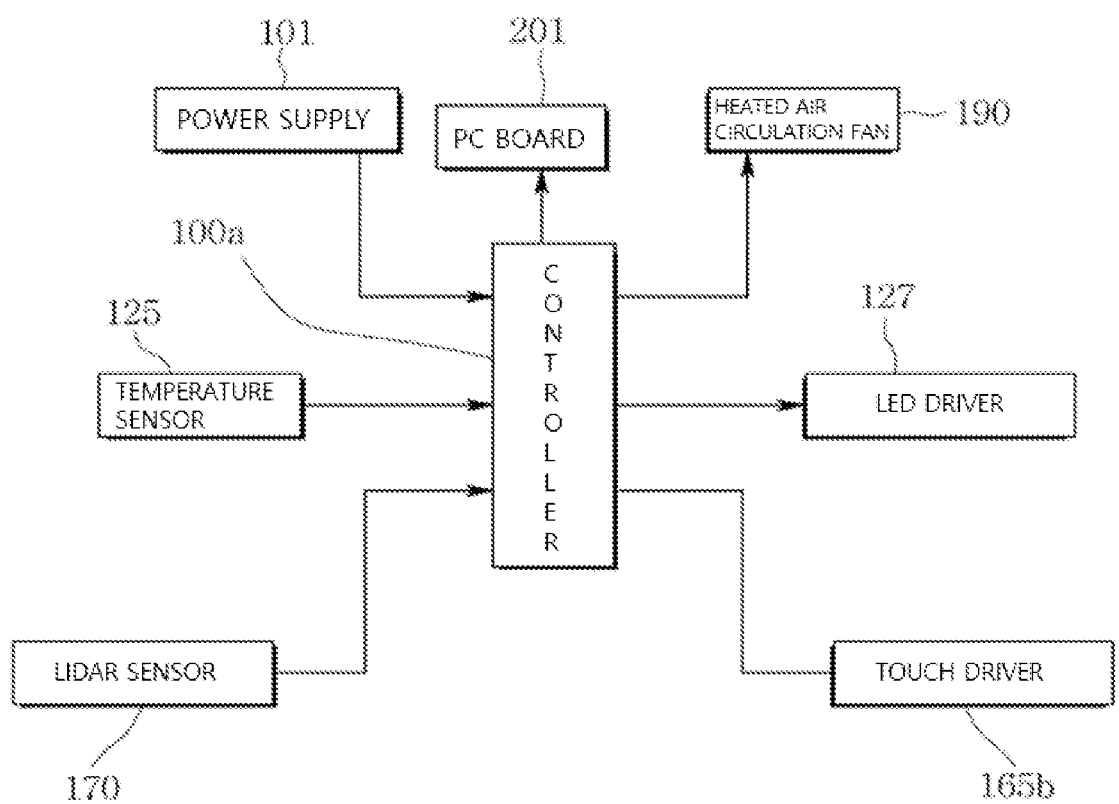
FIG. 6 is a driving control block diagram showing a driving control state of the touchscreen device shown in FIG. 4.
Figure 7:
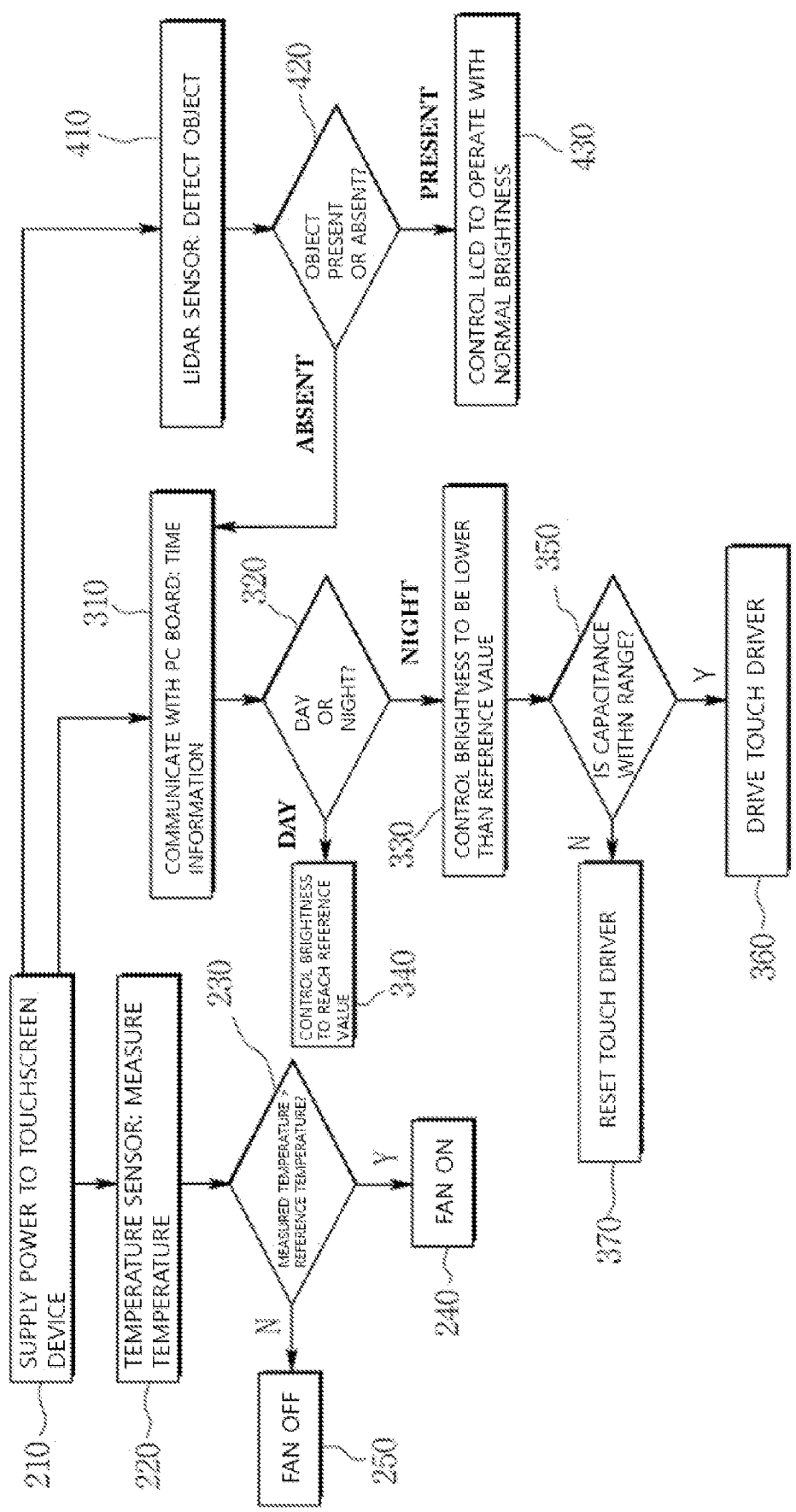
FIG. 7 is a schematic flowchart showing a method of controlling the touchscreen device according to the present invention.

FIG. 4 is a front view showing the front configuration of an electric vehicle charging kiosk to which a touchscreen device according to another embodiment of the present invention is applied, FIG. 5 is a cross-sectional view of the touchscreen device shown in FIG. 4, FIG. 6 is a driving control block diagram showing a driving control state of the touchscreen device shown in FIG. 4, and FIG. 7 is a schematic flowchart showing a method of controlling the touchscreen device according to the present invention.

The touchscreen device shown in FIG. 4 includes the same components as the touchscreen device shown in FIG. 1, and further includes a temperature sensor 125. Therefore, a detailed description of the same components will be omitted, and additional components will be mainly described.

As shown in FIG. 4, the touchscreen device according to another embodiment of the present invention further includes a temperature sensor 125.

At least one temperature sensor 125 is mounted near the touch panel 165 and the liquid crystal panel assembly 130. The temperature sensor 125 detects the ambient temperature of the touch panel 165 and the liquid crystal panel assembly 130.

In addition, as shown in FIG. 6, the touchscreen device includes a controller 100a, which receives a measured temperature (value) from the temperature sensor 125 and drives the heated air circulation fan 190 when the measured temperature is higher than a reference temperature (value), and a power supply 101, which supplies power to the heated air circulation fan 190 to drive the same.

In addition, as shown in FIG. 5, a heat dissipating member 193 may be inserted and mounted in the heated air flow space S in order to dissipate heat.

The heat dissipating member 193 includes a heat dissipating silicone member (e.g. a heat dissipating silicone sheet or a heat dissipating silicone pad).

The heat dissipating silicone member is a heat conductor that is usually manufactured in a pad form and is inserted into the heated air flow space S in order to effectively dissipate the heat generated from the backlight unit 150 to the outside.

Such a heat dissipating silicone member may be manufactured by mixing thermally conductive powders with a silicone resin, which has excellent heat resistance and electrical insulation, in a dispersed manner.

However, the heat dissipating silicone member is merely one embodiment of the present invention, and the heat dissipating member 193 is not limited to the heat dissipating silicone member, so long as the same is capable of dissipating heat in the state of being inserted into the heated air flow space S.

As shown in FIG. 6, the controller 100a controls the brightness of the LCD of the liquid crystal panel assembly 130 in response to a signal received from the LiDAR sensor 170, communicates with a personal computer (PC) board 201 through a universal asynchronous serial receiver and transmitter (UART) communication (serial communication) module mounted near the touchscreen device 100 to receive time information from the PC board 201, and controls the brightness of the LCD of the liquid crystal panel assembly 130 on the basis of the time information so that the ambient temperature of the liquid crystal panel assembly 130 drops.

The brightness of the LCD is controlled by the controller 100a controlling power (DC 5V/12V) of the power supply 101 that is supplied to an LED driver 127, which drives the plurality of high-brightness LEDs 163 serving as a light source of the backlight unit 150.

In addition, the controller 100a checks the capacitance value of the touch panel 165 to control driving of a touch driver 165b of the touch panel 165.

A method of controlling the touchscreen device 100 according to the present invention configured as described above will be described.

FIG. 7 is a schematic flowchart showing a method of controlling the touchscreen device according to the present invention.

Referring to FIGS. 4 to 7, according to the method of controlling the touchscreen device 100 according to the present invention, first, the power supply 101 applies power to the liquid crystal panel assembly 130 to drive the same (step 210).

That is, step 210 is a step in which the touchscreen device 100 is turned on by power supplied thereto.

Subsequently, the controller 100a receives the temperature measured by the temperature sensor 125 (step 220).

Subsequently, the controller 100a determines whether the received measured temperature is higher than a predetermined reference temperature (step 230).

In step 230, when the measured temperature is higher than the reference temperature, the heated air circulation fan 190 is controlled to be turned on, and when the measured temperature is not higher than the reference temperature, the heated air circulation fan 190 is controlled to be turned off (steps 240 and 250).

In addition, after step 210, the controller 100a performs communication (serial communication) with the PC board 201 of the touchscreen device 100 to receive time information from the PC board 201 in real time (step 310).

Subsequently, the controller 100a that has received the time information determines whether the current time is day or night on the basis of the time information (step 320).

When it is determined that the current time is night in step 320, the brightness of the LCD of the liquid crystal panel assembly 130 is controlled to be lower than a predetermined reference value (or standard value), and when it is determined that the current time is day in step 320, the brightness of the LCD of the liquid crystal panel assembly 130 is controlled to reach the reference value (steps 330 and 340).

Subsequently, after step 330, the controller 100a determines whether the capacitance value of the touch panel 165 is within a predetermined range (step 350).

When it is determined that the capacitance value of the touch panel 165 is within the predetermined range in step 350, the touch driver 165b configured to drive the touch panel 165 is controlled to be driven, and when it is determined that the capacitance value of the touch panel 165 is not within the predetermined range in step 350, the touch driver 165b is reset (steps 360 and 370).

In addition, after step 210, the LiDAR sensor 170 detects whether there is an object (e.g. a person) in the vicinity of the touchscreen device 100 (step 410).

Subsequently, the controller 100a receives an object detection signal from the LiDAR sensor 170, and determines whether the object has been detected (step 420).

When it is determined in step 420 that the object is present in the vicinity, the brightness of the LCD of the liquid crystal panel assembly 130 is controlled to reach the reference value (step 430).

That is, the LCD is controlled to operate with normal (or optimal) brightness so that a person can manipulate the touch panel 165 while viewing the screen of the touchscreen device 100.

The brightness of the LCD is controlled by the controller 100a controlling power (DC 5V/12V) that is supplied to the LED driver 127.

As described above, according to the method of controlling the touchscreen device 100 according to the present invention, at least one (preferably plural) temperature sensor 125 is mounted outside or inside the touchscreen device 100, and the controller 100a drives the heated air circulation fan 190 based on comparison between the measured temperature received from the temperature sensor 125 and the predetermined reference temperature.

Therefore, when the amount of heat generated is not too large, the heated air circulation fan 190 is turned off, whereby power consumption is reduced.

In addition, the brightness of the LCD is lowered at night on the basis of the time information received in real time from the PC board 201 so that the temperature of the liquid crystal panel assembly 130 is lowered, whereby the lifespan of the liquid crystal panel assembly 130 may be increased, and standby power consumption may be reduced.

In addition, when an object (e.g. a person) is detected by the LiDAR sensor 170, the LCD is controlled to operate with normal brightness, whereby a user may conveniently use the touchscreen device 100, standby power may be efficiently managed, and the lifespans of the LCD and the heated air circulation fan 190 may be increased.

In addition, the capacitance value of the touch panel 165 is checked, and when the capacitance value is out of a predetermined range, the touch driver 165b is reset, whereby defects in the touch panel 165 may be minimized.

The embodiments of the present invention have been explained with reference to the accompanying drawings. However, the embodiments of the present invention are not limited thereto, and it will be apparent to those skilled in the art that various modifications and other embodiments are possible within the scope of the invention.

Accordingly, the substantial scope of the invention shall be determined only by the appended claims.

The present invention is applicable to electric vehicles.

The invention claimed is:

1. A touchscreen device comprising:
a touch panel;
an LCD device mounted behind the touch panel and including:
  a liquid crystal panel assembly disposed behind the touch panel;
  a backlight unit disposed behind the liquid crystal panel assembly; and
  an LCD device bracket configured to fix and support the liquid crystal panel assembly and the backlight unit; and
at least one heated air circulation fan mounted behind the liquid crystal panel assembly in order to forcibly circulate heat between the touch panel and the liquid crystal panel assembly, wherein the at least one heated air circulation fan is securely mounted to the LCD device bracket within an air gap defined between the liquid crystal panel assembly and the backlight unit,
wherein a heated air flow space(S) is defined between the touch panel and the liquid crystal panel assembly, the heated air flow space(S) having a gap of 3 to 10 mm,
wherein the LCD device bracket has a plurality of heated air flow holes formed therein to allow heat in the heated air flow space(S) to be forcibly circulated therethrough, and
wherein the touchscreen device further comprises a spacer positioned directly between the touch panel and the liquid crystal panel assembly, the spacer being configured to maintain the gap and provide the heated air flow space(S).

2. The touchscreen device according to claim 1, further comprising:
an anti-reflection (AR) coating layer formed on a front surface of the touch panel in order to ensure anti-glare performance.

3. The touchscreen device according to claim 1, further comprising:
a LIDAR sensor mounted on one side of the touchscreen device, the LiDAR sensor being configured to generate a detection signal in response to detection of presence or absence of an object in a vicinity of the touchscreen device.

4. The touchscreen device according to claim 3, wherein the LiDAR sensor is mounted to a touch panel bracket of the touchscreen device.

5. The touchscreen device of claim 1, further comprising:
a heat dissipating member interposed within the heated air flow space located between the touch panel and the liquid crystal panel assembly to dissipate heat.

6. A touchscreen device comprising:
a touch panel;
an LCD device mounted behind the touch and including:
  a liquid crystal panel assembly disposed in front of the LCD device behind the touch panel;
  a backlight unit disposed behind the liquid crystal panel assembly; and an LCD device bracket configured to fix and support the liquid crystal panel assembly and the backlight unit;
at least one heated air circulation fan mounted behind the liquid crystal panel assembly in order to forcibly circulate heat between the touch panel and the liquid crystal panel assembly, wherein the at least one heated air circulation fan is securely mounted to the LCD device bracket within an air gap defined between the liquid crystal panel assembly and the backlight unit;
at least one temperature sensor mounted near the touch panel and the liquid crystal panel assembly, the at least one temperature sensor being configured to detect an ambient temperature of the touch panel and the liquid crystal panel assembly; and
a controller configured to receive a measured temperature from the temperature sensor and to drive the heated air circulation fan when the measured temperature is higher than a reference temperature,
wherein a heated air flow space is defined between the touch panel and the liquid crystal panel assembly,
wherein the LCD device bracket has a plurality of heated air flow holes formed therein to allow heat in the heated air flow space(S) to be forcibly circulated therethrough,
wherein the heated air flow space has a gap of 3 to 10 mm, and
wherein the touchscreen device further comprises a spacer positioned directly between the touch panel and the liquid crystal panel assembly, the spacer being configured to maintain the gap and provide the heated air flow space (S).

7. The touchscreen device according to claim 6, further comprising:
a heat dissipating member interposed within the heated air flow space located between the touch panel and the liquid crystal panel assembly to dissipate heat.

8. The touchscreen device according to claim 7, wherein the heat dissipating member comprises a heat dissipating silicone member.

9. The touchscreen device according to claim 6, further comprising:
a LIDAR sensor mounted on one side of the touchscreen device, the LiDAR sensor being configured to generate a detection signal in response to detection of presence or absence of an object in a vicinity of the touchscreen device,
wherein the controller controls brightness of an LCD of the liquid crystal panel assembly in response to a signal received from the LiDAR sensor.

10. The touchscreen device according to claim 9, wherein the LiDAR sensor is mounted to a bracket of the touchscreen device.

11. The touchscreen device according to claim 6, wherein the controller communicates with a PC board to receive time information in real time from the PC board, and controls brightness of an LCD of the liquid crystal panel assembly based on the time information so that an ambient temperature of the liquid crystal panel assembly is lowered.

12. The touchscreen device according to claim 6, wherein the controller checks a capacitance value of the touch panel to control driving of a touch driver of the touch panel.

* * * * *